(12) United States Patent
Pagnanelli

(10) Patent No.: US 9,772,972 B2
(45) Date of Patent: Sep. 26, 2017

(54) GENERATION OF HIGH-RATE SINUSOIDAL SEQUENCES

(71) Applicant: Syntropy Systems, LLC, Huntington Beach, CA (US)

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 0 days.

(21) Appl. No.: 15/205,817

(22) Filed: Jul. 8, 2016

(65) Prior Publication Data
US 2016/0321212 A1 Nov. 3, 2016

Related U.S. Application Data

(63) Continuation-in-part of application No. 14/729,013, filed on Jun. 2, 2015.

(60) Provisional application No. 62/026,022, filed on Jul. 17, 2014, provisional application No. 62/190,364, filed on Jul. 9, 2015, provisional application No. 62/327,156, filed on Apr. 25, 2016.

(51) Int. Cl.
| | |
|---|---|
| *G06F 1/04* | (2006.01) |
| *G06F 1/02* | (2006.01) |
| *G06F 1/03* | (2006.01) |
| *G06F 17/14* | (2006.01) |
| *H03H 17/04* | (2006.01) |

(52) U.S. Cl.
CPC .......... *G06F 17/147* (2013.01); *G06F 1/022* (2013.01); *G06F 1/0328* (2013.01); *G06F 1/04* (2013.01); *H03H 17/04* (2013.01)

(58) Field of Classification Search
CPC .............. G06F 1/02–1/022; G06F 1/03; G06F 1/0321–1/0342; G06F 1/04–1/08
USPC .......................... 708/270–272; 327/105–107
See application file for complete search history.

(56) References Cited

U.S. PATENT DOCUMENTS

| | | | |
|---|---|---|---|
| 4,454,486 A | 6/1984 | Hassun et al. | |
| 5,189,381 A | 2/1993 | Asghar et al. | |
| 5,701,393 A | 12/1997 | Smith, III et al. | |
| 6,614,813 B1 | 9/2003 | Dudley et al. | |
| 6,867,625 B1* | 3/2005 | Stoyanov ............... | H03B 21/00 327/105 |
| 7,109,808 B1* | 9/2006 | Pelt ........................ | G06F 1/0342 327/105 |
| 2002/0014983 A1* | 2/2002 | Honkanen .............. | H03B 28/00 341/147 |

(Continued)

OTHER PUBLICATIONS

L. K. Tan, E. W. Roth, G. E. Yee, H. Samueli, "A 800 MHz quadrature digital synthesizer with ECL-compatible output drivers in 0.8 μm CMOS", IEEE J. Solid-State Circuits, vol. 30, pp. 1463-1473, Dec. 1995.*

(Continued)

*Primary Examiner* — Matthew Sandifer
(74) *Attorney, Agent, or Firm* — Joseph G. Swan, P.C.

(57) ABSTRACT

Provided are, among other things, systems, apparatuses methods and techniques for generating discrete-time sinusoidal sequences. One such apparatus includes a plurality of parallel processing branches, with each of the parallel processing branches operating at a subsampled rate and utilizing a recursive filter to generate sub-rate samples which represent a different subsampling phase of a complete signal that is output by the apparatus.

13 Claims, 12 Drawing Sheets

(56) References Cited

U.S. PATENT DOCUMENTS

| | | | | |
|---|---|---|---|---|
| 2002/0165889 | A1* | 11/2002 | Huang | G06F 1/022 |
| | | | | 708/276 |
| 2007/0040589 | A1* | 2/2007 | Matoba | H03K 3/0315 |
| | | | | 327/105 |
| 2011/0231693 | A1* | 9/2011 | Mori | H03L 7/0991 |
| | | | | 713/500 |

OTHER PUBLICATIONS

International search report and written opinion from corresponding PCT application Serial No. PCT/US15/34467.
Chren W A et al: "Digital Oscillators over Finite Fields",1996 IEEE International Conference on Acoustics, Speech, and Signal Processing—Proceedings (ICASSP), Atlanta, May 7-10, 1996; [IEEE International Conference on Acoustics, Speech, and Signal Processing [Junk] Proceedings. (ICASSP)], New York, IEEE, US, vol. Conf. 21, May 7, 1996 (May 7, 1996), pp. 3209-3212, XP000681739, DO 1: 10.1109/ICASSP.1996.550559, ISBN: 978-0-7803-3193-8.
Turner, Clay S. "Recursive discrete-time sinusoidal oscillators." IEEE Signal Processing Magazine 20.3 (2003): 103-111.
Prosecution history of parent U.S. Appl. No. 14/729,013.

* cited by examiner

GENERATION OF HIGH-RATE SINUSOIDAL SEQUENCES

This application is a continuation in part of U.S. patent application Ser. No. 14/729,013, filed on Jun. 2, 2015 and titled "Generation of High-Rate Sinusoidal Sequences" which, in turn, claimed the benefit of U.S. Provisional Patent Application Ser. No. 62/026,022, filed on Jul. 17, 2014, and titled "Method and Apparatus for Generating High-Rate Sine Sequences". The present application also claims priority to U.S. Provisional Patent Application Ser. No. 62/190,364, filed on Jul. 9, 2015, and U.S. Provisional Patent Application Ser. No. 62/327,156, filed on Apr. 25, 2016. The foregoing applications are incorporated by reference herein as though set forth herein in full.

FIELD OF THE INVENTION

The present invention pertains to systems, apparatuses, methods and techniques relating to the generation a discrete-time sequence that represents the samples of a continuous-time sine wave.

BACKGROUND

Many digital signal processing (DSP) applications require the generation of discrete-time, sinusoidal sequences to perform functions such as up/down conversion, signal synthesis, and tone detection/tracking. Conventional methods for the generation of discrete-time sinusoidal sequences generally fall into two categories: 1) phase accumulation oscillators that use a lookup table to transform a phase-step input ($\theta$) into a corresponding sinusoidal sample ($x_n = \sin(\phi + \theta)$); and 2) recursive oscillators that produce a current sinusoidal sample ($x_n = \sin(\phi+\theta)$) representing a phase-step of $\theta$, using a combination of prior output samples (i.e., $x_{n-1} = \sin(\phi)$, $x_{n-2} = \sin(\phi-\theta)$, ... ). The sinusoidal samples $x_n$ conventionally are generated at the full Nyquist rate, such that the sampling rate $f_S$, and the frequency $f = \theta/2\pi \cdot f_S$, of the sinusoidal sequence are related by $f \leq \frac{1}{2} \cdot f_S$ (i.e., f the underlying continuous-time sine wave is less than one-half the sampling rate associated with the discrete-time sequence). At lower sampling rates (i.e., at sampling rates where $f_S \leq \frac{1}{2} \cdot f_S$), aliasing causes a high-frequency sequence produced by conventional methods to be indistinguishable from a lower-frequency image resulting from folding about the Nyquist frequency of $\frac{1}{2} \cdot f_S$. The present inventor has come to appreciate that sampling rate constraints limit the utility of conventional approaches in applications that require very high-speed operation.

FIG. 1 is a block diagram which illustrates a conventional phase accumulation oscillator (i.e., oscillator 10). In combination, adder 13 and register 11 produce phase output 2 that, with each cycle of the sampling clock $f_S = f_{CLK}$, steps by an amount determined by phase input 1 (i.e., the output steps in phase by an amount equal to $\theta$ on each sampling period $T_S = 1/f_S$). The phase at output 3 is converted into a sinusoidal sample, with amplitude $x_n = \sin(\phi_n + \theta)$, using sine lookup table 19, which maps phase to amplitude. Adder 13 and register 11 implement the first-order difference equation $\phi_n = \theta + \phi_{n-1}$, and the corresponding transfer function from phase input 1 to phase output 2 is given by $$H(z) = \frac{z^{-1}}{1 - z^{-1}},$$

where the z-transform variable z represents a unit delay equal to one full-rate sampling period $T_S$. The samples at output 3 are those of a sinusoidal sequence with frequency $f = \theta/2\pi \cdot f_S$, provided that $f \leq \frac{1}{2} \cdot f_S$ (i.e., $\theta \leq \pi$). Otherwise, aliasing (i.e., frequency folding) results in an output frequency $f = (n - \theta/2\pi) \cdot f_S$, where n is the smallest integer such that $0 \leq f \leq \frac{1}{2} \cdot f_S$. It should be noted that the initial value of register 11 does not affect the output frequency f, and therefore, register 11 is not preset to any particular value in a conventional implementation.

An alternative apparatus for generating sinusoidal sequences is conventional discrete-time oscillator 20, which is illustrated in FIG. 2. Oscillator 20 is conventionally referred to as a direct-form recursive oscillator, which in one respect, can be distinguished from conventional oscillator 10 by the absence of a sine lookup table. The operation of oscillator 20 is based on the recursion relation $$\cos(\phi_n \pm \theta) = 2 \cdot \cos(\theta) \cdot \cos(\phi_n) - \cos(\phi_n - \phi) \leftrightarrow x_n = 2 \cdot \cos(\theta) \cdot x_{n-1} - x_{n-2},$$

which is easily derived from angle sum and difference formulas for trigonometric functions, and has been known since at least the time of French mathematician Francois Viète in the 1500 s. Oscillator 20 uses multiplier 12, adder 13 and registers 11A&B to implement the above recursion relation, which has the corresponding discrete-time transfer function given by $$H(z) = \frac{1}{1 - 2 \cdot \cos(\theta) \cdot z^{-1} + z^{-2}},$$

where the z-transform variable z represents a unit delay equal to one full-rate sampling period $T_S$. The recursion relation produces samples at output 3B, which like the phase accumulation oscillator of FIG. 1, are those of a sinusoidal sequence with frequency $f = \theta/2\pi \cdot f_S$ when $f \leq \frac{1}{2} \cdot f_S$ (i.e., $\theta \leq \pi$). In addition, the output samples of the recursive oscillator are like those of the phase accumulation oscillator, in that aliasing results in an output frequency of $f = (n - \theta/2\pi) \cdot f_S$ when $f > \frac{1}{2} \cdot f_S$ (i.e., and as before, n is the smallest integer such that $0 \leq f \leq \frac{1}{2} \cdot f_S$). It should be noted that in order to ensure oscillation at start-up, at least one of registers 11A&B has an initial value which is non-zero. But otherwise, the initial values of registers 11A&B do not affect the output frequency f, and therefore, the values of registers 11A&B are not preset to any specific value in a conventional implementation.

Conventionally, the discrete-time oscillators illustrated in FIGS. 1&2 are also grouped into multi-oscillator systems of the type shown in FIGS. 3A-C. Conventional oscillator 30, illustrated in FIG. 3A, is sometimes referred to as a coupled-quadrature oscillator. Output 4 and output 5 of oscillator 30 are in quadrature with respect to each other, meaning that each of these outputs has the same frequency, but the phase of one output is shifted by 90 degrees relative to the phase of the other. The operation of quadrature oscillator 30 is based on the trigonometric identities:

$$\cos(\phi_n + \theta) = \cos(\theta) \cdot \cos(\phi_n) - \sin(\theta) \cdot \sin(\phi_n) \leftrightarrow x_n = \cos(\theta) \cdot x_{n-1} - \sin(\theta) \cdot y_{n-1} \text{ and}$$

$$\sin(\phi_n + \theta) = \sin(\theta) \cdot \cos(\phi_n) - \cos(\theta) \cdot \sin(\phi_n) \leftrightarrow y_n = \sin(\theta) \cdot x_{n-1} - \cos(\theta) \cdot y_{n-1},$$

where the outputs $x_n$ and $y_n$ are coupled in the sense that each output depends not only on its past value, but also on the past value of the other output. Conventional oscillator 35, illustrated in FIG. 3B, produces a multi-tone signal (i.e., output 6) by summing two sequences $y_n$ and $\hat{y}_n$ which have different frequencies (e.g., sinusoidal sequence $y_n$ has angular frequency $\omega_1 = 2 \cdot \pi \cdot f_1$ and sinusoidal sequence $\hat{y}_n$ has angular frequency $\omega_2 = 2 \cdot \pi \cdot f_2$). FIG. 3C illustrates a conventional oscillator (i.e., oscillator 40) which produces a frequency modulated output. Referring to FIG. 3C, the recursive oscillator composed of multiplier 12B, adder 13B, and registers 11C&D produces sinusoidal sequence $y_n$ (i.e., output 8), which modulates the frequency of sinusoidal sequence $x_n$ (i.e., output 7) via multiplier 12A. In should be noted that for conventional oscillators 30, 35, and 40, the initial values of registers 11A-D are of no particular importance, except that for oscillation to occur, every register cannot have a zero value at start-up.

Conventional methods for generating sinusoidal sequences employ circuits (e.g., adders, multipliers, or registers) that operate at a rate (i.e., the full sampling rate $f_S$) which is at least twice as high as the frequency of the sinusoidal sequence they produce (i.e., the frequency f of the underlying continuous-time sine wave). At lower sampling rates, aliasing causes a high-frequency sequence to be indistinguishable from a lower frequency image produced by folding about the Nyquist frequency of $\frac{1}{2} \cdot f_S$. And this problem is not resolved by conventional systems that employ multiple oscillators to produce a quadrature sequence (e.g., conventional oscillator 30), a multi-tone sequence (e.g., conventional oscillator 35), and/or a frequency-modulated sequence (e.g., conventional oscillator 40).

SUMMARY OF THE INVENTION

The present invention provides an improved discrete-time oscillator which uses parallel processing branches to generate a sinusoidal sequence with an effective sampling rate, $f_S$, that is higher than the operating frequency of any of the processing branches (e.g., adders, multipliers and registers). Relative to the sampling rate $f_S$, each processing branch operates at a subsampled rate, and effectively, each branch produces a sequence that would be obtained by subsampling a full-rate sinusoidal sequence at different subsampling phases (i.e., each branch generates a different polyphase component of a full-rate sinusoidal sequence). Compared to a conventional oscillator, a discrete-time oscillator according to the preferred embodiments of the present invention, can generate samples of a sinusoidal sequence having a frequency $f = \theta / 2\pi \cdot f_S$ which is greater than one-half the rate at which a processing branch operates. Therefore, such a discrete-time oscillator can be particularly advantageous in DSP applications, where due to parallel processing, the effective computational rates exceed the limits of the native processing circuitry.

Thus, one specific embodiment of the invention is directed to an apparatus for generating the discrete-time samples of a real-valued sinusoidal waveform, and includes: 1) an output line for providing an output that is discrete in time and in value; 2) a plurality of processing branches coupled to the output line, with each processing branch including a recursive digital filter; 3) a first input line for configuring the frequency of the discrete-time sinusoidal output; and 4) a second input line for configuring the initial state of the recursive digital filter. Each of the parallel processing branches operates at a subsampled rate, and utilizes a recursive filter to generate sub-rate samples which represent a different subsampling phase of a complete signal that is output by the apparatus. More specifically, the outputs of the parallel processing branches reflect a subsampling rate which is m times less than the full sampling rate ($f_S$) of a complete sinusoidal sequence (i.e., a subsampling rate is equal to $1/m \cdot f_S$), where m is the number of parallel processing branches. The recursive filter within any processing branch, operates independently of the recursive filter within any other processing branch, and generates subsampled outputs via a linear combination of prior output samples from the same branch. The transfer function of each filter represents a recursive form of the angle sum and difference formulas for trigonometric functions. Also, signals are input to set both the frequency and subsampling phase of the sinusoidal sequence at the output of each processing branch. The frequency is adjusted via an input line which configures at least one coefficient of each recursive filter. The subsampling phase is determined by the initial state of the recursive filter which is controlled via a second input line. In a variation of this specific embodiment, the output of the different processing branches are provided as inputs to a multiplexing circuit, which combines multiple, sub-rate inputs into a single, full-rate output (i.e., the multiplexer combines processing branch outputs with a subsampling rate of $1/m \cdot f_S$ into a sequence with an effective sampling rate of $f_S$).

Another embodiment of the invention is directed to an apparatus for generating the discrete-time samples of a complex-valued sinusoidal waveform, and includes: 1) two output lines for providing as separate real and imaginary parts, a complex output that is discrete in time and in value; 2) a plurality of processing branches coupled to the output lines, with each processing branch including a recursive digital filter; 3) a first input line for configuring the frequency of the discrete-time sinusoidal output; and 4) a second input line for configuring the initial state of the recursive digital filter. The real and imaginary parts of a complex sinusoidal output are represented, respectively, as in-phase (cosine) and quadrature (sine) components which are offset in phase by 90 degrees. Each of the parallel processing branches operates at a subsampled rate, and utilizes a recursive filter to generate sub-rate samples which represent a different subsampling phase of a complete complex signal that is output by the apparatus. More specifically, the outputs of the parallel processing branches reflect a subsampling rate which is m times less than the full sampling rate ($f_S$) of a complete sinusoidal sequence (i.e., a subsampling rate is equal to $1/m \cdot f_S$), where m is the number of parallel processing branches. The recursive filter within any processing branch operates independently of the recursive filter within any other processing branch, and comprises two stages: 1) a first stage which generates an in-phase (cosine) component; and 2) a second stage which generates a quadrature (sine) component. The two stages of each recursive filter are coupled such that the output of each stage is a linear combination of a prior output sample from both stages, and the transfer function of each filter represents a recursive form of the angle sum and difference formulas for trigonometric functions. Also, signals are input to set both the frequency and subsampling phase of the sinusoidal sequence at the output of each processing branch. The frequency is adjusted via an input line which configures at least one coefficient of each recursive filter. The subsampling phase is determined by the initial state of the two-stage recursive filter which is controlled via a second input line. In a variation of this specific embodiment, the output of the different processing branches are provided as inputs to a multiplexing circuit, which combines multiple, sub-rate inputs into a single, full-rate output (i.e., the multiplexer combines processing branch outputs with a subsampling rate of $1/m \cdot f_S$ into a sequence with an effective sampling rate of $f_S$).

An alternate specific embodiment of the invention is directed to an apparatus for generating the discrete-time samples of a sinusoidal waveform, and includes: 1) an output line for providing an output that is discrete in time and in value; 2) a plurality of processing branches coupled to the output line, with each processing branch including a phase accumulator and a sine lookup table; 3) a first input line for configuring the frequency of the discrete-time output via a phase-step value; and 4) a second input line for configuring a phase offset at the output of the phase accumulator. Each of the parallel processing branches operates at a subsampled rate and utilizes a phase accumulator coupled to sine lookup table to generate sub-rate samples which represent a different subsampling phase of a complete signal that is output by the apparatus. More specifically, the outputs of the parallel processing branches reflect a subsampling rate which is m times less than the full sampling rate ($f_S$) of a complete sinusoidal sequence (i.e., a subsampling rate is equal to $1/m \cdot f_S$), where m is the number of parallel processing branches. Input signals are used to set both the phase-step and the phase offset of the phase accumulator, to respectively control the output frequency and the subsampling phase, respectively, of the sinusoidal sequence at the output of each processing branch. In one variation of this specific embodiment, the outputs of the different processing branches are provided as inputs to a multiplexing circuit, which combines multiple, sub-rate inputs into a single, full-rate output (i.e., combines processing branch outputs with a subsampling rate of $1/m \cdot f_S$ into a sequence with an effective sampling rate of $f_S$). In a second variation of this specific embodiment, the output of a phase accumulator is coupled to the input of a sine lookup table via an adder, which provides a means for offsetting the phase value at the output of the phase accumulator.

A discrete-time oscillator created by incorporating one or more of the specific embodiments of the invention described above, can produce a discrete-time sinusoidal sequence with a higher frequency and a higher sampling rate than is possible with conventional discrete-time oscillators. Such an oscillator can be used for various commercial, industrial and military applications, e.g., in various direct conversion transmitters, software-defined or cognitive radios, multi-channel communication transmitters, all-digital RADAR systems, and high-speed arbitrary waveform generators.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

DESCRIPTION OF THE PREFERRED
EMBODIMENT(S)

Figure 4:
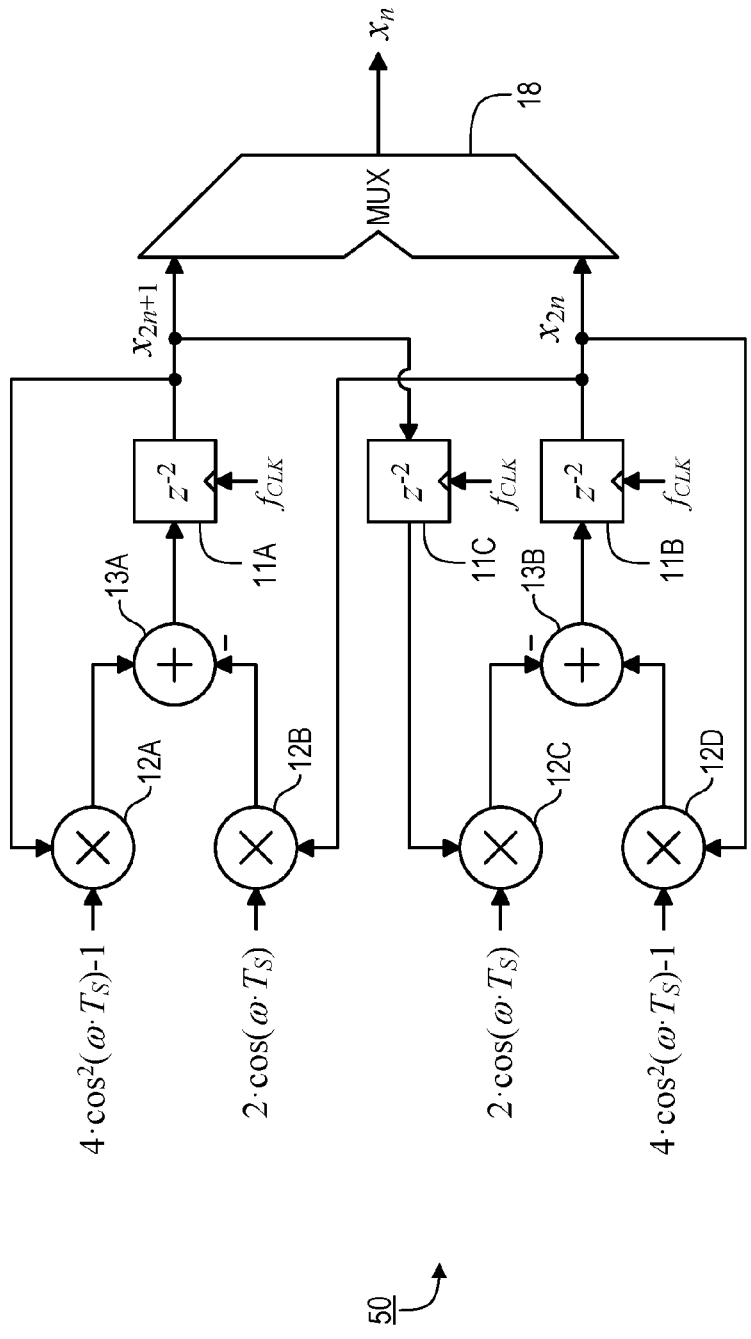
FIG. 4 is a block diagram of a discrete-time oscillator which uses conventional polyphase decomposition to realize an effective sampling rate which is twice as high as the operating rate of its constituent circuitry, but which results in recursive structures that are not independent and are unstable.

The present inventor recognized that the sampling rate of the sinusoidal sequences produced by conventional means is limited by the maximum operating rates (i.e., the maximum clocking frequency) of the circuit components which comprise the generating apparatus. One might contemplate a solution to this problem based on conventional polyphase decomposition methods to arrive at circuit 50, illustrated in FIG. 4, for a polyphase decomposition factor of m=2. According to conventional polyphase decomposition methods, the processing for circuit 50 is derived by iterating the recursion relation for the direct-form recursive oscillator (i.e., two iterations for a polyphase decomposition factor of m=2), to obtain $$x_{2n}=(4\cdot\cos^2(\theta)-1)\cdot x_{2n-2}-2\cdot\cos(\theta)\cdot x_{2n-3} \text{ and}$$

$$x_{2n+1}=(4\cdot\cos^2(\theta)-1)\cdot x_{2n-1}-2\cdot\cos(\theta)\cdot x_{2n-2},$$

such that a pair of current outputs (e.g., $x_{2n}$ and $x_{2n+1}$) are simultaneously calculated from previous outputs which have been delayed by at least two sampling clock periods. It should be noted that conventional polyphase decomposition results in an oscillator structure having multiple parallel processing branches (e.g., a first processing branch to produce output $x_{2n}$ and a second processing branch to produce output $x_{2n+1}$) which do not operate independently, since the current output of one processing branch depends on delayed outputs from other processing branches (e.g., current output $x_{2n}$ of a first processing branch depends on delayed output $x_{2n-3}$ from a second processing branch). The present inventor has discovered, however, that the resulting recursive filter structures are unstable, and that the number of bits required to represent the filter coefficients grows geometrically with polyphase decomposition factor m (i.e., grows geometrically with the number of iterations on the recursion relation for the direct-form recursive oscillator). Although modern digital signal processors use methods, such as parallel processing, to overcome limitations in the clocking rates of constituent components, these methods have not been adapted for use in discrete-time oscillators. Therefore, the present invention provides novel architectures that allow sinusoidal sequences to be generated at effective sampling rates which are higher than the maximum clocking rates of the constituent components.

Figure 5A:
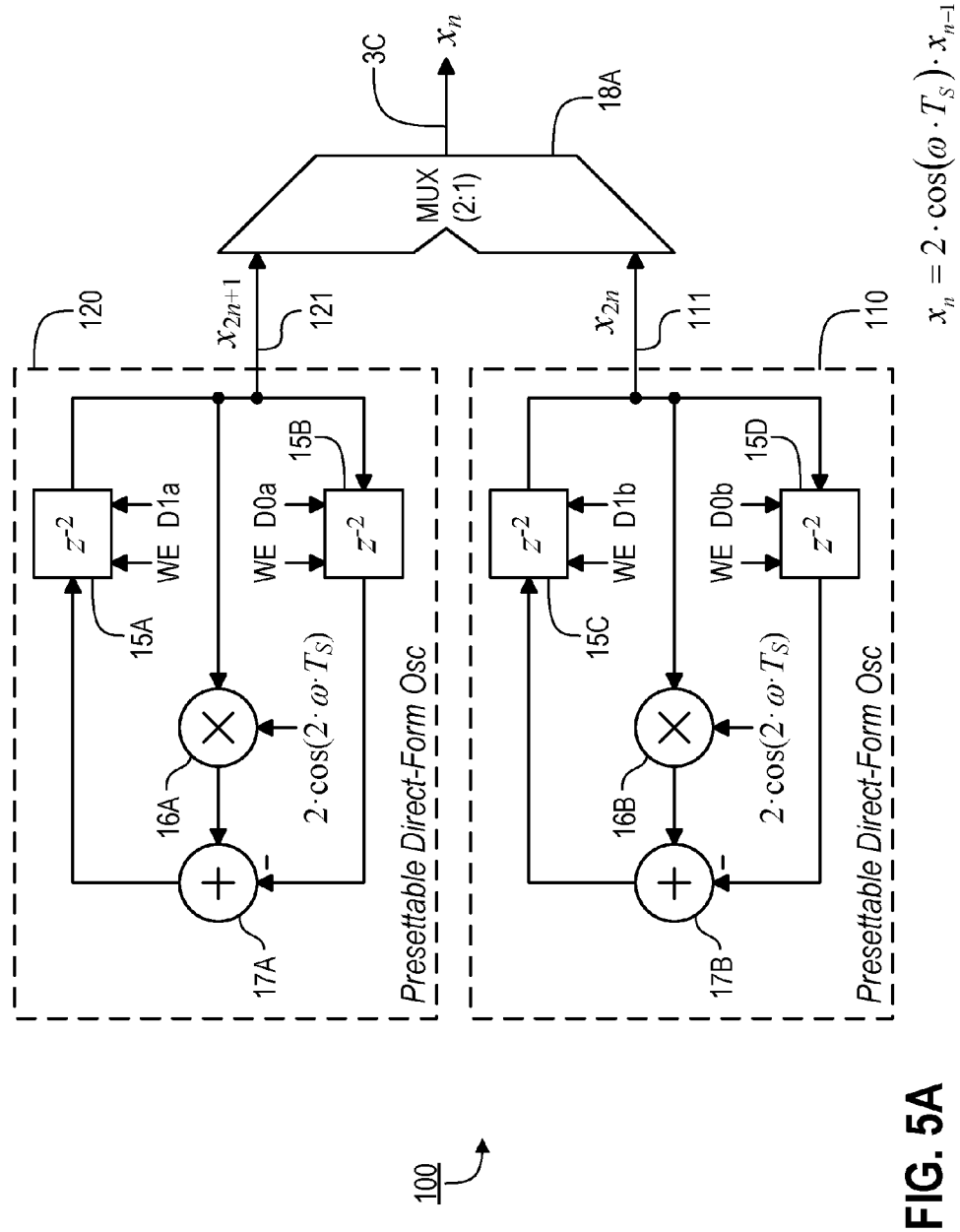
FIG. 5A is a block diagram of an exemplary implementation of a discrete-time oscillator which uses an output multiplexer, and two parallel processing branches with recursive filters and writable registers, to realize an effective sampling rate which is twice as high as the operating rate of a processing branch.

A discrete-time oscillator circuit 100 that uses parallel processing branches to generate sinusoidal sequences with an effective sampling rate, $f_S$, that is higher than the operating rate of each parallel branch, is shown in FIG. 5A. Referring to the exemplary embodiment illustrated in FIG. 5A, circuit 100 incorporates m=2 parallel processing branches (e.g., branches 110 and 120), with each branch containing a recursive digital filter comprised of an adder (e.g., adder 17A or 17B), a multiplier (e.g., multiplier 16A or 16B), and writable registers (e.g., registers 15A&B or 15C&D). Each of registers 15A-D introduces a delay τ equal to two full-rate periods (i.e., $\tau=2\cdot T_S=2/f_S$), and each register is preferably implemented as a single-stage register clocked at a half-rate of $\frac{1}{2}\cdot f_S$, rather than as a two-stage register clocked at a full-rate of $f_S$. Regardless of register implementation, however, the multiply-accumulate function performed by adder 17A or 17B with multiplier 16A or 16B, respectively, occurs at one-half rate. The recursive digital filter in each processing branch 110 or 120, implements the difference equation:

$$y_n = 2\cdot\cos(2\cdot\omega\cdot T_S)\cdot y_{n-2} - y_{n-4},$$

with corresponding discrete-time transfer function, $$H(z) = \frac{1}{1 - 2\cdot\cos(2\cdot\omega\cdot T_S)\cdot z^{-2} + z^{-4}},$$

where the z-transform variable z represents a unit delay of one full-rate period $T_S$. The present inventor has discovered that a discrete-time oscillator that implements the above difference equation and corresponding transfer function, generates an output sequence which is subsampled by a factor of two, such that the output sequence represents every other value of a sampled sine wave with frequency $f=\omega/2\pi$ (i.e., the output sequence represents subsamples of a full-rate sinusoidal sequence). In the preferred embodiments, the frequency of the sampled (full-rate) sine wave is controlled by programming the filter coefficient represented by the $2\cdot\cos(2\cdot\omega\cdot T_S)$ term in the above difference equation, and a common filter coefficient is used within each processing branch. At a clocking rate of $f_S$, each subsample occurs twice (i.e., each output sample is replicated two times), and at a clocking rate of $\frac{1}{2}\cdot f_S$, each subsample occurs only once (i.e., output subsamples are not replicated). In the preferred embodiments, therefore, the clocking rate of each processing branch is $\frac{1}{2}\cdot f_S$, when the number of processing branches m is equal to two, and each subsample appears only once at the output of the recursive filter within each of the processing branches. The inventor has also discovered that the phase of the subsampled output sequence (i.e., the offset with which the full-rate sequence is effectively subsampled) depends on the initial condition of the recursive filter in each processing branch. For an initial condition of $$y_{n-2}(t_0)=\cos(2\cdot\omega\cdot T_S) \text{ and } y_{n-4}(t_0)=\cos(4\cdot\omega\cdot T_S),$$

the phase φ of the subsampled output sequence is zero (i.e., subsampling begins with the first full-rate sample), and for an initial condition of $$y_{n-2}(t_0)=\cos(\omega\cdot T_S) \text{ and } y_{n-4}(t_0)=\cos(3\cdot\omega\cdot T_S),$$

the phase φ of the subsampled output sequence is one (i.e., subsampling begins with the second full rate sample). For this reason, in the preferred embodiments the initial conditions (i.e., the initial state) of the recursive filter in each of the processing branches are established, so that in combination, the subsampled sequences produced by the various processing branches provide all the samples of a complete, full-rate sequence. In the exemplary embodiment of circuit 100, in FIG. 5A, such an initial filter state is provided by writable filter registers 15A-D, having both write enable (e.g., WE) and data (e.g., D0a, D1a, D0b, and D1b) inputs.

In the exemplary embodiment of circuit 100, the subsampled outputs of the recursive digital filter within each processing branch (e.g., output 111 of branch 110 and output 121 of branch 120) are combined into a full-rate sequence (i.e., at output 3C) using 2:1 multiplexer 18A. Multiplexer 18A has two inputs that operate at a subsampling rate of $\frac{1}{2}\cdot f_S$, and a single output that operates at the full sampling rate of $f_S$. The operation of multiplexer 18A is such that samples at the multiplexer input appear in sequential order at the multiplexer output. Referring to circuit 100 in FIG. 5A, the subsampled output of the first processing branch (i.e., output 111 of branch 110) is given by $$x_{2n}=x_0,x_2,x_4,x_6,x_8,$$

and the subsampled output of the second processing branch (i.e., output 121 of branch 120) is given by $$x_{2n+1}=x_1,x_3,x_5,x_7,x_9,$$

Consequently, the full-rate output (i.e., output 3C) of multiplexer 18A is given by $$x_n=x_0,x_1,x_2,x_3,x_4,x_5,x_6,x_7,x_8,x_9,$$

In alternate embodiments, such as those where, for post-processing purposes, multiple sub-rate outputs are preferable to a single full-rate output, the multiplexer operation is absent.

Figure 5B:
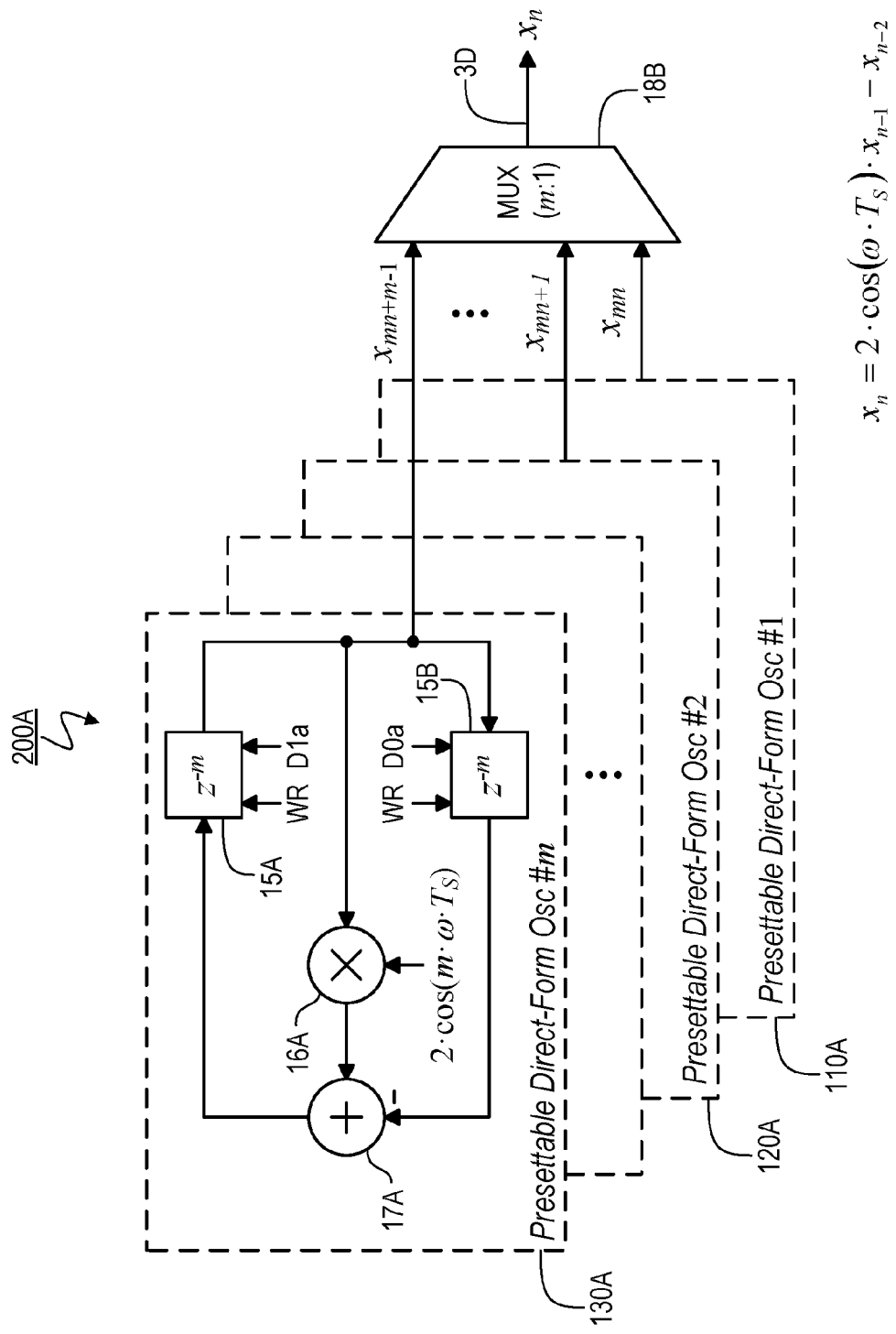
FIG. 5B is a block diagram of an exemplary implementation of a discrete-time oscillator which uses an output multiplexer, and a number m of parallel processing branches with recursive filters and writable registers, to produce a real-valued sinusoid and realize an effective sampling rate which is m-times greater than the operating rate of a processing branch.

More generally, a discrete-time oscillator circuit according to the preferred embodiments of the invention has m parallel processing branches, as illustrated by circuit 200A in FIG. 5B. The recursive digital filter in each of the processing branches (e.g., branches 110A through 130A), implements the difference equation:

$$y_n = 2 \cdot \cos(m \cdot \omega \cdot T_S) \cdot y_{n-m} - y_{n-2m},$$

with corresponding discrete-time transfer function, $$H(z) = \frac{1}{1 - 2 \cdot \cos(m \cdot \omega \cdot T_S) \cdot z^{-m} + z^{-2m}},$$

where, as before, the z-transform variable z represents a unit delay of one full-rate period $T_S$. A discrete-time oscillator that implements the above difference equation and corresponding transfer function, generates an output sequence which is subsampled by a factor of m, such that in the preferred embodiments, the clocking rate of each processing branch is $1/m \cdot f_S$ and each subsample appears only once at the output of the recursive filter within each of the processing branches. The phase $\phi \in \{0, 1, 2, \ldots, m-1\}$ of the subsampled output sequence (i.e., the offset with which the full-rate sequence is effectively subsampled) depends on the initial state (i.e., the initial register values) of the recursive filter in each processing branch, according to $$y_{n-2m}(t_0) = \cos((m-\phi) \cdot \omega \cdot T_S) \text{ and } y_{n-4m}(t_0) = \cos((2m-\phi) \cdot \omega \cdot T_S).$$

It can be readily appreciated by those skilled in the art, that the initial state defined by the above equations results in a cosine waveform, and that alternatively, a sine waveform is generated for an initial state given by)

$$y_{n-2m}(t_0) = -\sin((m-\phi) \cdot \omega \cdot T_S) \text{ and } y_{n-4m}(t_0) = -\sin((2m-\phi) \cdot \omega \cdot T_S).$$

Therefore, a different initial state preferably is established for the recursive filter in each of the processing branches (e.g., using writeable filter registers as shown in FIG. 5B), so that in combination, the subsampled sequences produced by the m processing branches provide all the samples of a complete, full-rate sequence (i.e., together the processing branches provide subsequences at all the subsampling phases). In addition, in the preferred embodiments the frequency of the output sequence is controlled, e.g., by setting the filter coefficient represented by the $2 \cdot \cos(m \cdot \omega \cdot T_S)$ term in the above difference equation as shown in FIG. 5B. Also, in the exemplary embodiment of circuit 200, the subsampled outputs of the recursive digital filter within each of the m processing branches are combined into a full-rate sequence (i.e., at output 3D) using m:1 multiplexer 18B. In alternate embodiments, however, the multiplexer operation is absent and post-processing takes place on multiple sub-rate outputs. If present, multiplexer 18B has m inputs that operate at a subsampling rate of $1/m \cdot f_S$, and a single output that operates at the full sampling rate of $f_S$. The operation of multiplexer 18B is such that samples at the multiplexer input appear in sequential order at the multiplexer output.

Figure 1:
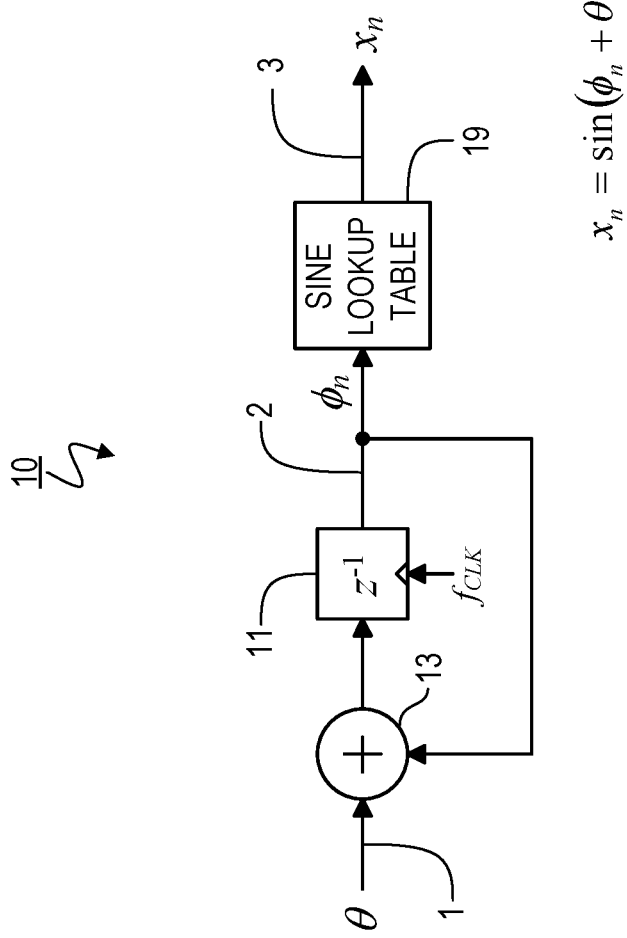
FIG. 1 is a block diagram of a conventional discrete-time oscillator which utilizes a digital phase accumulator and a sine lookup table to generate a sinusoidal output sequence.
Figure 2:
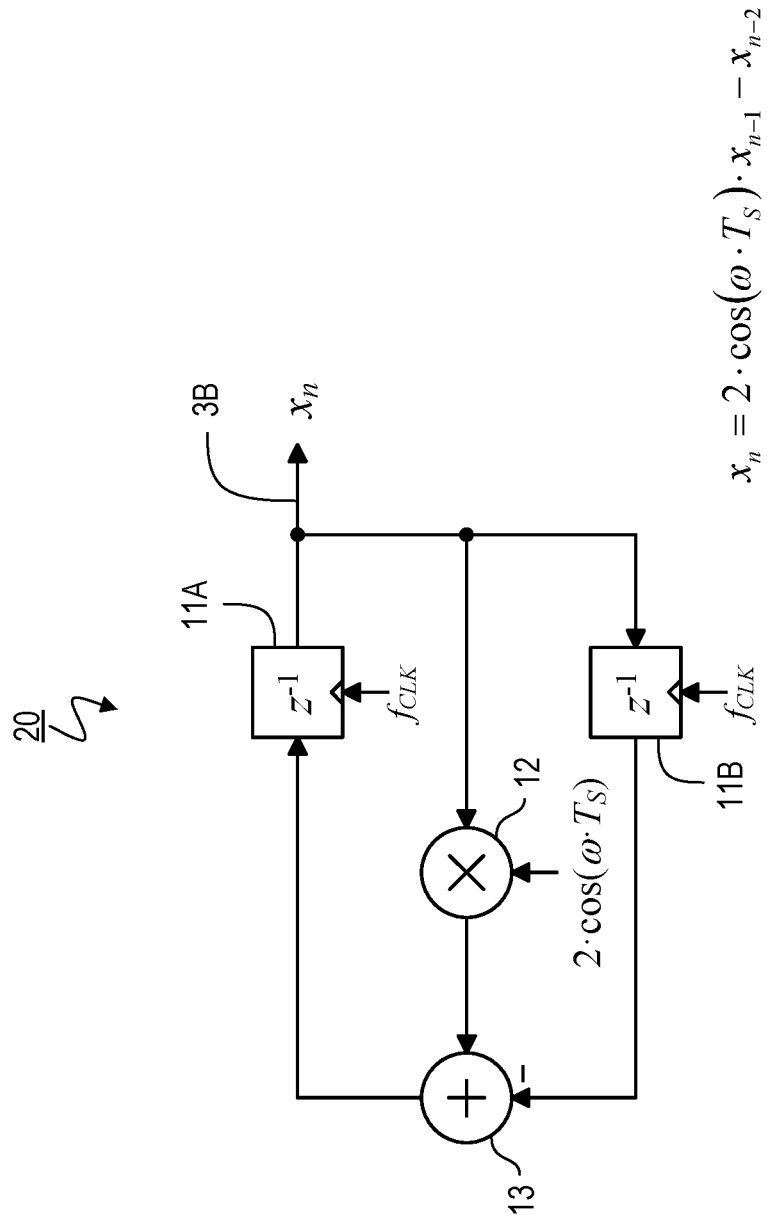
FIG. 2 is a block diagram of a conventional discrete-time oscillator which utilizes an adder, a multiplier, and delay registers to generate current sinusoidal output samples from prior sinusoidal output samples, in accordance with a single trigonometric recursion formula.
Figure 3A:
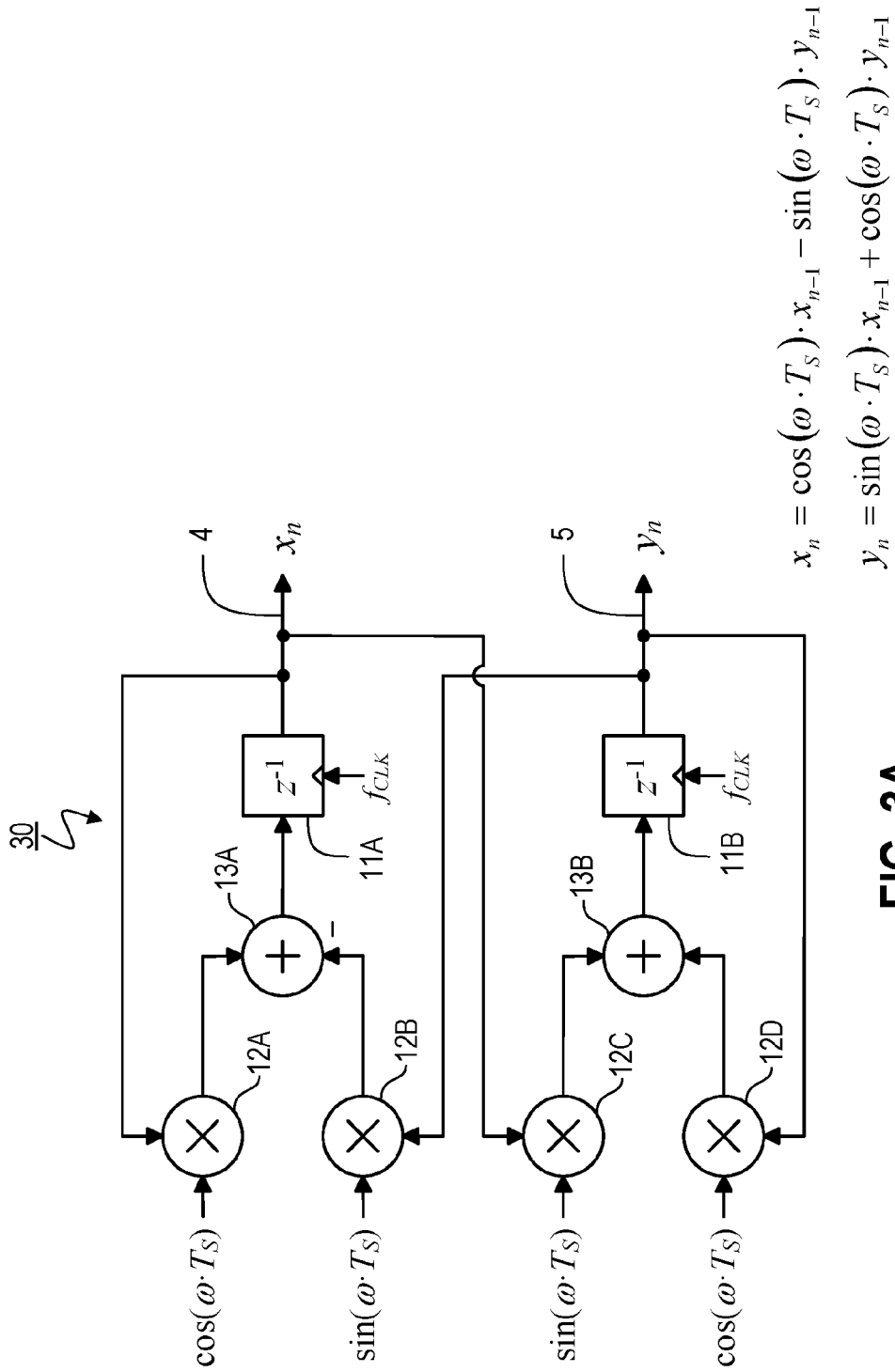
FIG. 3A is a block diagram of a conventional discrete-time oscillator which utilizes adders, multipliers, and registers to generate current quadrature sinusoidal outputs based on prior quadrature outputs, in accordance with a pair of trigonometric recursion formulas.

The exemplary embodiment of circuit 200A, in FIG. 5B, produces a real-valued sinusoid using parallel processing branches which comprise a single-stage recursive filter (i.e., the recursive filter consisting of multiplier 16A and adder 17A). In alternate embodiments, however, each processing branch utilizes a multi-stage recursive filter to produce complex-valued, multi-tone, and/or frequency-modulated waveforms. Each processing branch (e.g., branches 110B through 130B) of exemplary oscillator 200B, shown in FIG. 5C, produces a subsampled sequence (subsequence) that is complex-valued by means of a two-stage recursive filter (e.g., a first stage that includes multipliers 16B&C and adder 17B, and a second stage that includes multipliers 16D&E and adder 17C), which is comparable in structure to a conventional quadrature oscillator (e.g., circuit 30 of FIG. 3A). In the preferred embodiments, the complex-valued outputs of each processing branch are provided as separate real (cosine) and imaginary (sine) parts, where a first filter stage generates an in-phase component (e.g., real outputs x that are coupled to line 4A in FIG. 5C) and a second filter stage generates a quadrature component (e.g., imaginary outputs y that are coupled to line 5A in FIG. 5C), such that each component is offset in phase by 90 degrees. More specifically, the two-stage recursive filter in each processing branch (e.g., branches 110B, 120B and 130B) of exemplary quadrature oscillator 200B, implements the difference equations:

$$x_n = \cos(m \cdot \omega \cdot T_S) \cdot x_{n-m} - \sin(m \cdot \omega \cdot T_S) \cdot y_{n-m} \text{ and}$$

$$y_n = \sin(m \cdot \omega \cdot T_S) \cdot x_{n-m} + \cos(m \cdot \omega \cdot T_S) \cdot y_{n-m},$$

where m is the number of processing branches. The frequency $f = \omega/2\pi$ of the full-rate output sequence, is controlled by programming the recursive filter coefficients, which preferably, are the same for each processing branch and are given by $\cos(m \cdot \omega \cdot T_S)$ and $\sin(m \cdot \omega \cdot T_S)$ in FIG. 5C (e.g., as inputs to multipliers 16B&E and multipliers 16C&D, respectively). The phase $\phi \in \{0, 1, 2, \ldots, m-1\}$ of a subsampled output sequence (i.e., the offset with which each processing branch effectively subsamples the full-rate sequence) depends on the initial value $x_n(t_0)$ of register 15C, and the initial value $y_n(t_0)$ of register 15D, according to $$x_n(t_0) = \cos((m-\phi) \cdot \omega \cdot T_S) \text{ and } y_n(t_0) = -\sin((m-\phi) \cdot \omega \cdot T_S)$$

Figure 3B:
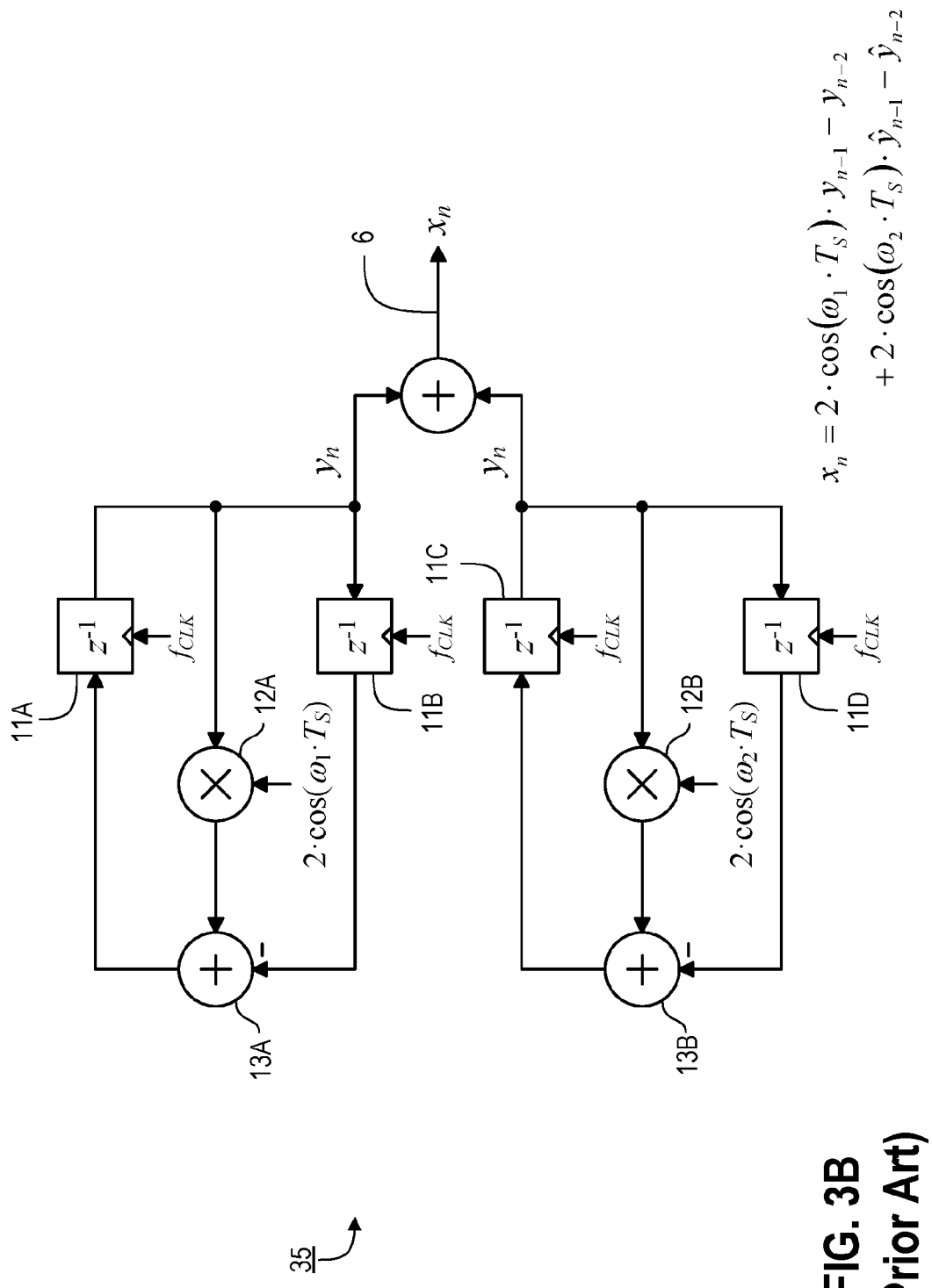
FIG. 3B is a block diagram of a conventional discrete-time oscillator which uses a recursive structure comprising adders, multipliers, and registers to generate sinusoidal output samples having two distinct frequency components.
Figure 3C:
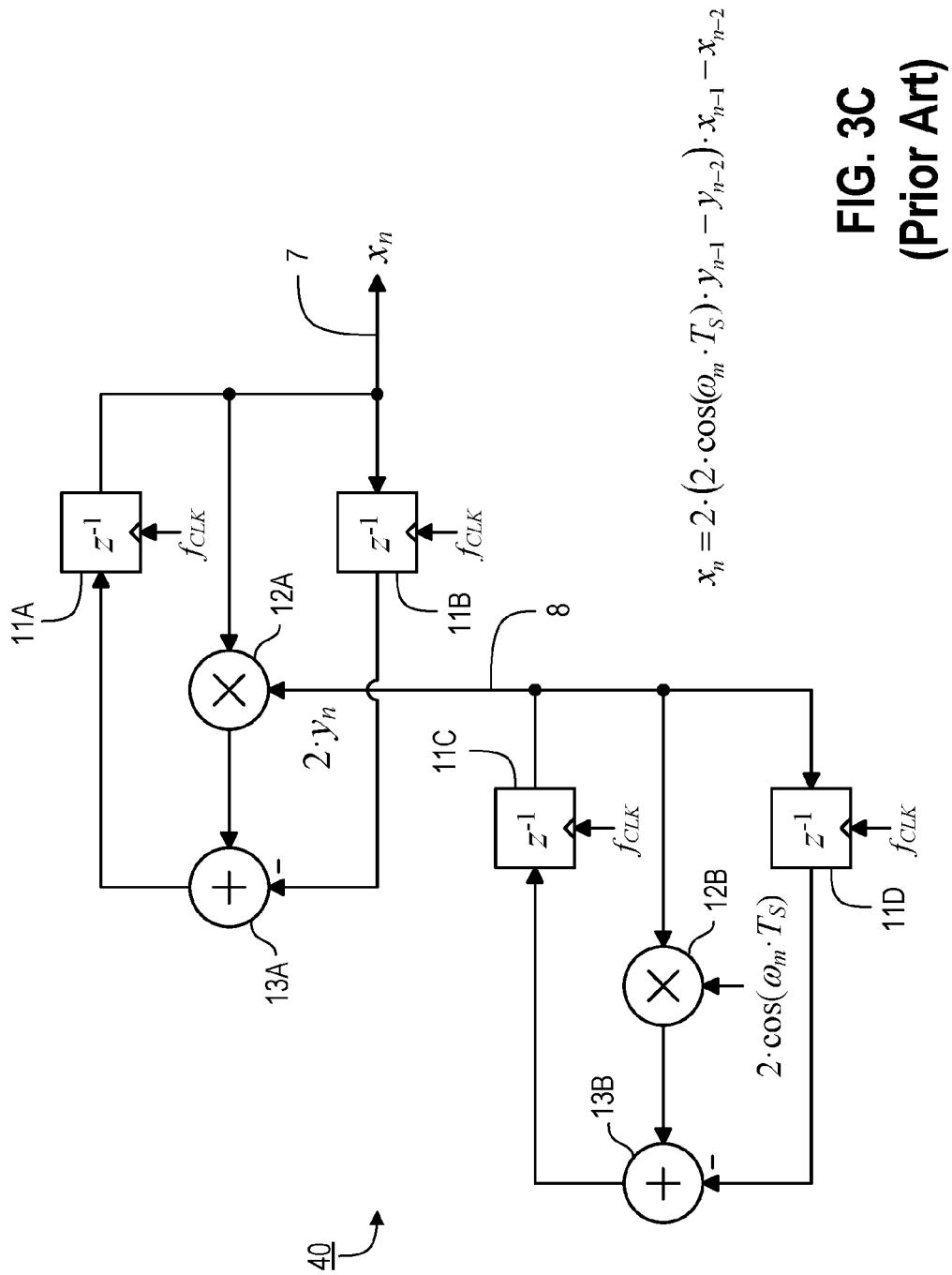
FIG. 3C is a block diagram of a conventional discrete-time oscillator which uses a recursive structure comprising adders, multipliers, and registers to generate sinusoidal output samples that are frequency modulated.
Figure 5C:
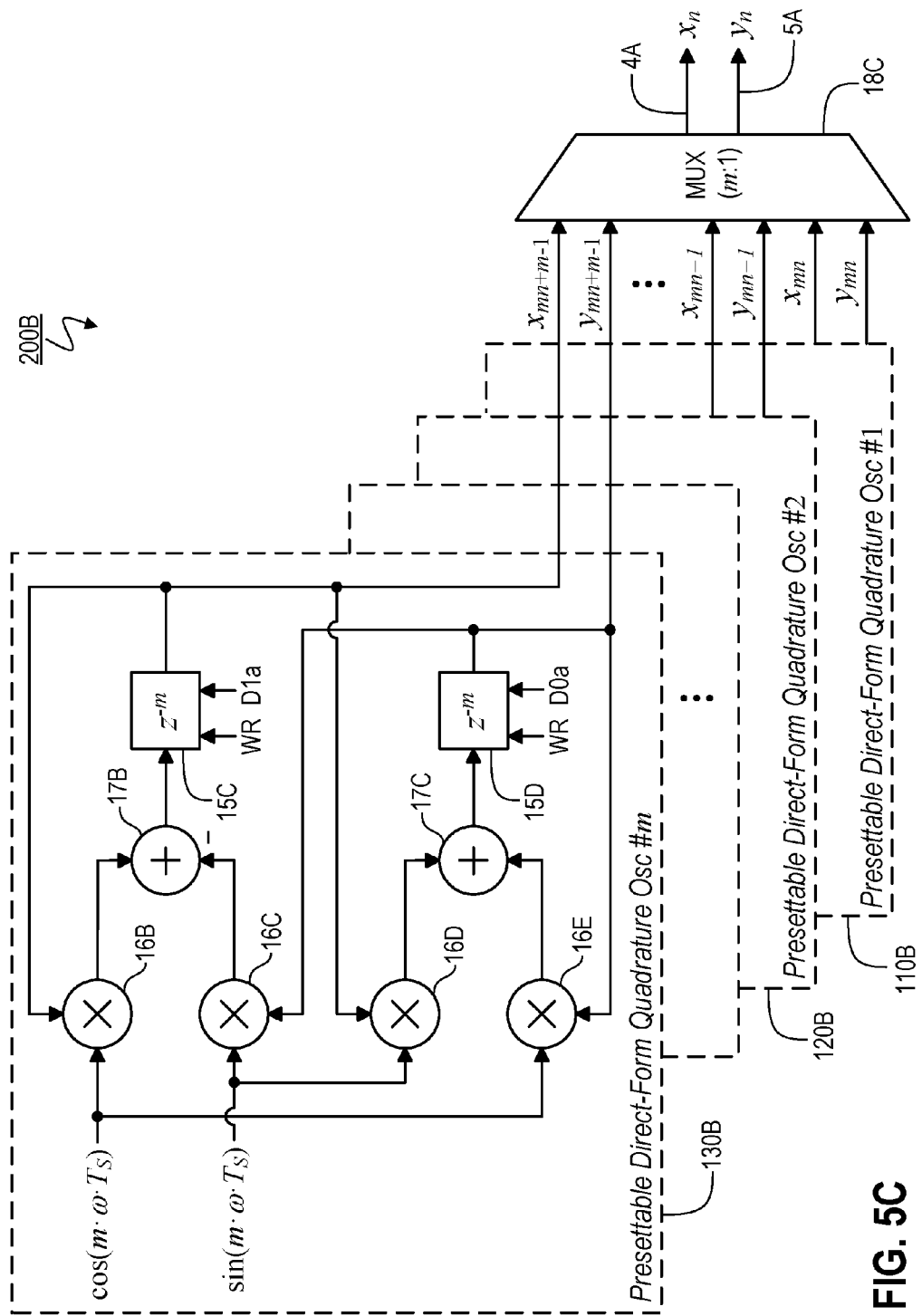
FIG. 5C is a block diagram of an exemplary implementation of a discrete-time oscillator, which produces a complex-valued sinusoid using a parallel arrangement of m recursive filters, each of which includes four multipliers, two adders, and two writable registers.

(i.e., the subsampling phase depends on the initial state of the recursive filter in each processing branch). Therefore, a different initial state preferably is established for the two-stage recursive filter in each of the processing branches (e.g., using writeable filter registers as shown in FIG. 5C), such that in combination, the complex-valued subsequences produced by the m processing branches provide all the complex-valued samples of a complete, full-rate sequence (i.e., together the processing branches provide subsequences at all the subsampling phases). In the embodiment of circuit 200B, the subsampled sequences are combined within m:1 multiplexer 18C, which receives m complex-valued inputs at a subsampling rate of $1/m \cdot f_S$, and generates a single, complex-valued output at a full sampling rate of $f_S$ (e.g., as the real sequence of samples on line 4A and the imaginary sequence of samples on line 5A). It can be readily appreciated by those skilled in the art, that the present invention can be adapted to produce other waveform types, for example, using parallel processing branches which incorporate other recursive filter structures, including structures like those conventionally utilized to generate multi-tone waveforms (e.g., conventional oscillator 35 of FIG. 3B) and/or to generate frequency-modulated waveforms (e.g., conventional oscillator 40 of FIG. 3C). The alternate embodiments resulting from such adaptations should also be considered within the scope of the invention. Also, in the present embodiment the output provided by multiplexer 18C includes two lines, one for the real output samples and one for the imaginary output samples. In alternate embodiments, both such samples are multiplexed onto a single output line.

Figure 5D:
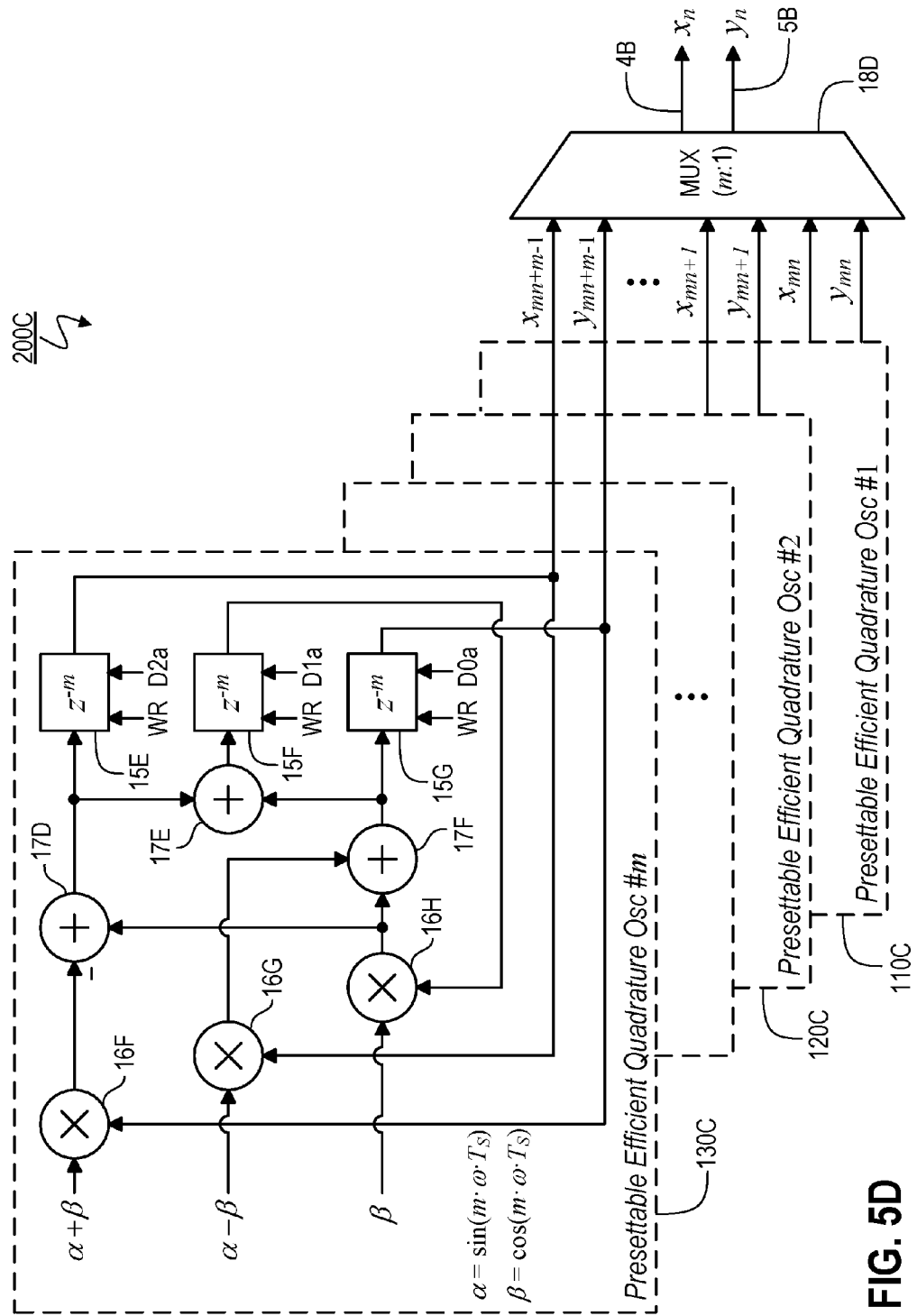
FIG. 5D is a block diagram of an exemplary implementation of a discrete-time oscillator, which produces a complex-valued sinusoid using a parallel arrangement of m recursive filters, each of which includes three multipliers, three adders, and three writable registers.

Exemplary oscillator 200C, shown in FIG. 5D, is an alternative embodiment for generating complex-valued, multi-tone, and/or frequency-modulated waveforms. Like exemplary oscillator 200B, each processing branch of exemplary oscillator 200C (e.g., branches 110C through 130C) utilizes a multi-stage recursive filter to produce a subsampled sequence (subsequence) that is complex-valued. In the preferred embodiments, this complex-valued subsequence is provided as separate real (cosine) and imaginary (sine) parts. Exemplary quadrature oscillator 200C differs from exemplary oscillator 200B, however, in that the recursive filter in each processing branch of oscillator 200C implements the difference equations:

$$x_n = \cos(m \cdot \omega \cdot T_S) \cdot (x_{n-m} + y_{n-m}) - (\sin(m \cdot \omega \cdot T_S) + \cos(m \cdot \omega \cdot T_S)) \cdot y_{n-m} \text{ and}$$

$$y_n = \cos(m \cdot \omega \cdot T_S) \cdot (x_{n-m} + y_{n-m}) + (\sin(m \cdot \omega \cdot T_S) - \cos(m \cdot \omega \cdot T_S)) \cdot x_{n-m},$$

where: 1) m is the number of processing branches; 2) $x_n$ are samples representing the real part of a complex-valued output; and 3) $y_n$ are samples representing the imaginary part of a complex-valued output. In accordance with the above difference equations, therefore, recursive filtering within each processing branch of exemplary oscillator 200C involves only three multiplication operations (e.g., multipliers 16F-H), compared to four multiplication operations for the recursive filtering within each processing branch of oscillator 200B (e.g., multipliers 16B-E). Generally, an implementation with fewer multipliers is preferred because multipliers are more complex circuits than adders and registers. Besides the three multiplication operations, recursive filtering within each processing branch of oscillator 200C includes three addition operations (e.g., adders 17D-F) and three registering operations (e.g., writeable registers 15E-G). The frequency $f = \omega/2\pi$ of the full-rate output sequence is controlled by programming the recursive filter coefficients, which preferably, are the same for each processing branch and are given by $\alpha + \beta = \sin(m \cdot \omega \cdot T_S) + \cos(m \cdot \omega \cdot T_S)$, $\alpha - \beta = \sin(m \cdot \omega \cdot T_S) - \cos(m \cdot \omega \cdot T_S)$, and $\beta = \cos(m \cdot \omega \cdot T_S)$ in FIG. 5D (e.g., as inputs to multipliers 16F-H, respectively). The phase $\phi \in \{0, 1, 2, \ldots, m-1\}$ of a subsampled output sequence (i.e., the offset with which each processing branch effectively subsamples the full-rate sequence) depends on the initial value $x_n(t_0)$ of register 15E, the initial value $x_n(t_0) + y_n(t_0)$ of register 15F, and the initial value $y_n(t_0)$ of register 15G, where $$x_n(t_0) = \cos((m-\phi) \cdot \omega \cdot T_S) \text{ and } y_n(t_0) = -\sin((m-\phi) \cdot \omega \cdot T_S)$$

(i.e., the subsampling phase depends on the initial state of the recursive filter in each processing branch). In the preferred embodiments of oscillator 200C, the recursive filter within each of the m processing branches is set to a different initial state (e.g., using writeable filter registers as shown in FIG. 5D), such that in combination, the complex-valued subsequences produced by the processing branches, provide all the subsampling phases for reconstructing a complete, full-rate sequence. Preferably, these complex-valued subsequences are provided to an m:1 multiplexer (e.g., multiplexer 18D) at a subsampling rate of $1/m \cdot f_S$, and the multiplexer sequentially selects from its various inputs to produce a complete sequence at an output sampling rate of $f_S$ (e.g., as the real sequence of samples on line 4B and the imaginary sequence of samples on line 5B). In alternate embodiments, however, such as those where subsequent parallel processing occurs, the complex-valued subsequences can retain their separate identities.

Figure 6A:
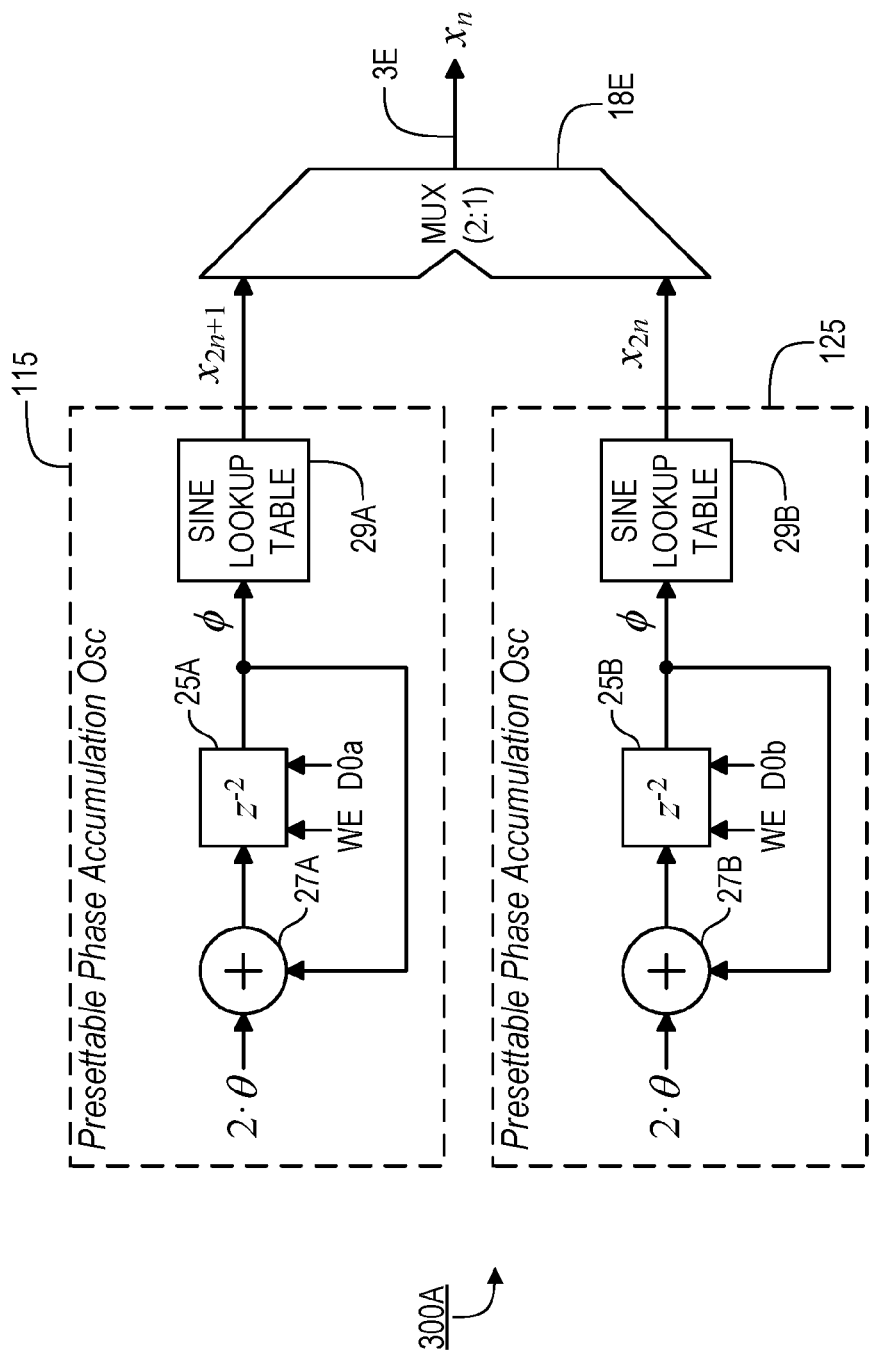
FIG. 6A is a block diagram of an exemplary implementation of a discrete-time oscillator which uses an output multiplexer, and two parallel processing branches with writable accumulators and a sine lookup tables, to realize an effective sampling rate which is twice as high as the operating rate of a processing branch.

Although in the preferred embodiments, the parallel processing branches contain recursive digital filters, in alternate embodiments, the parallel processing branches use other approaches to generate a set of subsampled sinusoidal sequences that can be combined to form a full-rate sinusoidal sequence. Exemplary discrete-time oscillator circuits 300A&B, shown in FIGS. 6A&B, generate subsampled sinusoidal sequences using parallel processing branches that contain phase accumulators and sine lookup tables. Referring to the exemplary embodiment illustrated in FIG. 6A, circuit 300A incorporates m=2 parallel processing branches (e.g., branches 115 and 125), with each branch containing a phase accumulator comprised of an adder (e.g., adder 27A or 27B) and a writable register (e.g., register 25A or 25B). Each of registers 25A&B introduces a delay r equal to two full-rate periods (i.e., $\tau = 2 \cdot T_S = 2/f_S$), and each register preferably is implemented as a single-stage register clocked at a half-rate of $\frac{1}{2} \cdot f_S$, rather than as a two-stage register clocked at a full-rate of $f_S$. Regardless of register implementation, however, the phase accumulation function performed by adder 27A or 27B with register 25A or 25B, occurs at one-half rate. Therefore, the phase accumulator in each processing branch 115 or 125 implements the difference equation:

$$\phi_n = 2 \cdot \theta + \phi_{n-2},$$

with corresponding discrete-time transfer function, $$H(z) = \frac{2}{1 - z^{-2}},$$

where the z-transform variable z represents a unit delay of one full-rate period $T_S$. The present inventor has discovered that a discrete-time oscillator that implements the above difference equation and corresponding transfer function, accumulates phase at a rate of $2 \cdot \theta \cdot (\frac{1}{2} \cdot f_S)$. And at a clocking rate of $\frac{1}{2} \cdot f_S$, the discrete-time oscillator generates an output sequence representing every other value of a sampled sine wave with frequency $f = \theta/2\pi \cdot f_S$ (i.e., the output sequence represents subsampling, without replication, by a factor of 2 on a full-rate sequence). In the preferred embodiments, therefore, the clocking rate of each processing branch is $\frac{1}{2} \cdot f_S$, when the number of processing branches m is equal to two, and is more generally equal to $1/m \cdot f_S$ for subsampling by a factor of m. In addition, in the preferred embodiments the frequency of the output sequence is controlled by setting the phase-step value $\theta$ that appears in the above difference equation, e.g., as shown in FIG. 6A.

Figure 6B:
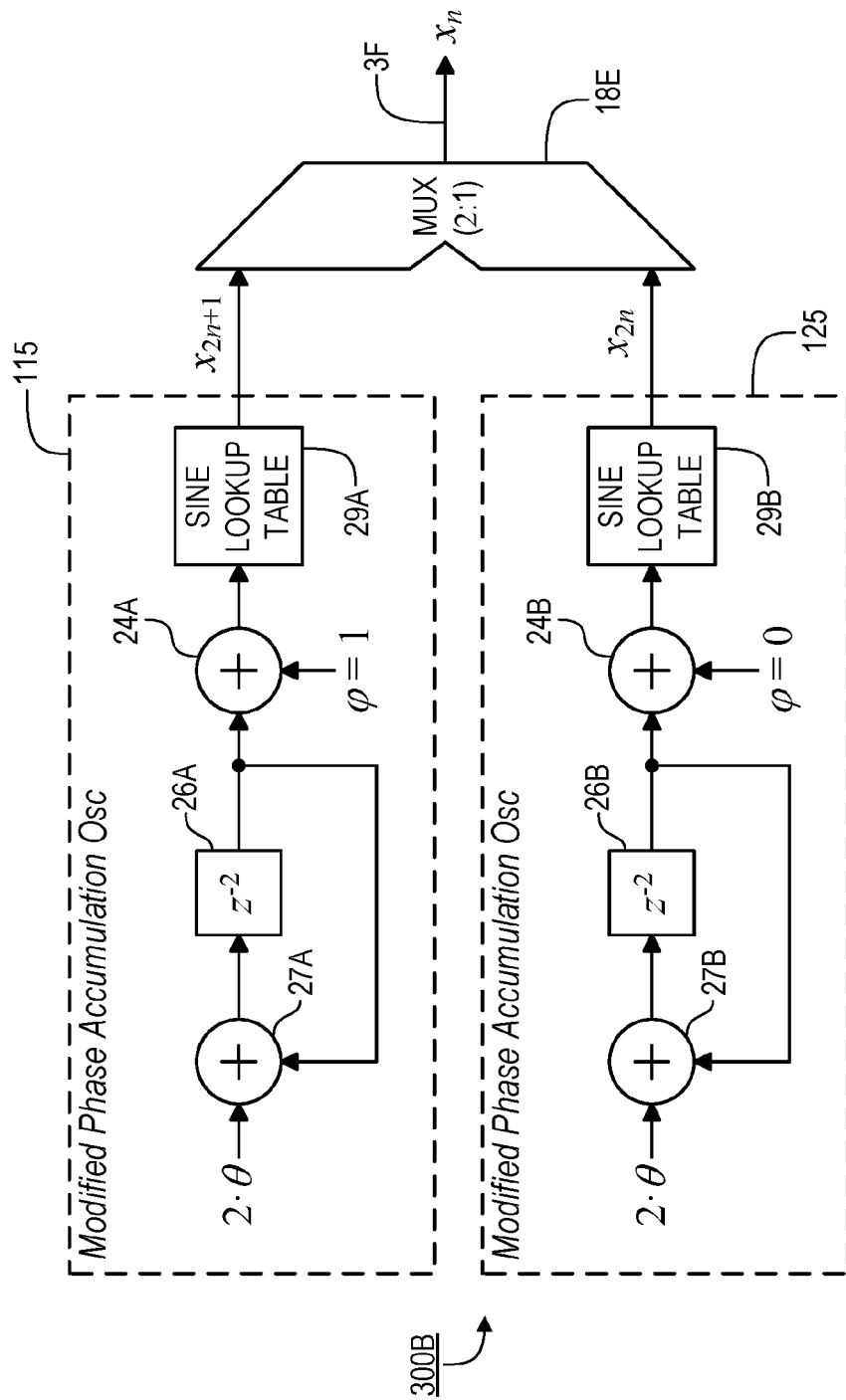
FIG. 6B is a block diagram of an exemplary implementation of a discrete-time oscillator which uses an output multiplexer, and two parallel processing branches with phase-offset adders and sine lookup tables, to realize an effective sampling rate which is twice as high as the operating rate of a processing branch.

In addition, the inventor has discovered that the phase of the subsampled output sequence (i.e., the offset with which the full-rate sequence is subsampled) depends on the initial condition of the phase accumulator within each processing branch. For an initial condition of $$\phi_{n-2}(t_0) = 0,$$

the phase $\phi$ of the subsampled output sequence is zero (i.e., subsampling begins with the first full-rate sample), and for an initial condition of $$\phi_{n-2}(t_0) = 1,$$

the phase $\phi$ of the subsampled output sequence is one (i.e., subsampling begins with the second full rate sample). In general, the initial condition of the phase accumulation preferably is $$\phi_{n-2}(t_0) = \phi,$$

for a subsampling phase equal to $\phi$. In the preferred embodiments, the subsampling phase of each processing branch is established so that, in combination, the subsampled sequences produced by the different processing branches collectively provide all the samples of a complete, full-rate sequence. In exemplary circuit 300A, a phase accumulator with writeable registers (e.g., a registers 25A&D having both write enable and data inputs) is used to establish the subsampling phase of each processing branch. In the alternative embodiment of circuit 300B, shown in FIG. 6B, the subsampling phase is established using an adder (e.g., adder 24A or 24B), which couples the output of the phase accumulator (e.g., the output of register 26A or 26B, respectively) to the sine lookup table (e.g., lookup table 29A or 29B, respectively), and offsets the accumulator output by an amount equal to $\phi$. In the exemplary embodiments of circuits 300A&B, the subsampled outputs of the parallel processing branches are combined into a full-rate sequence (i.e., at output 3E or 3F) using 2:1 multiplexer 18A. In alternate embodiments, however, the multiplexer operation is absent and post-processing takes place on multiple sub-rate outputs.

ADDITIONAL CONSIDERATIONS

As used herein, the term "coupled", or any other form of the word, is intended to mean either directly connected or connected through one or more other elements or processing blocks.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for generating discrete-time samples of a complex-valued sinusoidal waveform, comprising:
   a system output for providing real and imaginary output samples of a complex-valued sinusoid, said output samples being discrete in time and in value and collectively representing the complex-valued sinusoid at a desired full sampling rate; and
   a plurality of processing branches coupled to the system output, each of said processing branches including a recursive digital filter that operates at a subsampled rate, relative to the desired full sampling rate, and comprises: (a) a first multiplier having: a first input coupled to a first frequency value that establishes a frequency of the complex-valued sinusoid, a second input, and an output; (b) a second multiplier having: a first input coupled to a second frequency value that establishes the frequency of the complex-valued sinusoid, a second input, and an output; (c) a first writeable delay register having: a first input coupled to the output of the first multiplier, a second input that receives a first initial value for establishing a phase of said processing branch, and an output coupled to the system output and also coupled to the second input of the second multiplier; and (d) a second writeable delay register having: a first input coupled to the output of the second multiplier, a second input that receives a second initial value for establishing the phase of said processing branch, and an output coupled to the system output and also coupled to the second input of the first multiplier,
   wherein each of said recursive digital filters includes a first stage for generating real samples of the complex-valued sinusoid as an in-phase component, and a second stage for generating imaginary samples of the complex valued sinusoid as a quadrature component,
   wherein each of said processing branches operates at the subsampled rate and generates an output sequence at said subsampled rate that represents a different subsampling phase of the complex-valued sinusoid at the desired full sampling rate, and
   wherein said recursive digital filter within each said processing branch operates independently of the recursive digital filter within the other processing branches and produces each subsampled output via a linear combination of exactly one immediately prior real output sample and exactly one immediately prior imaginary output sample generated the recursive digital filter within said processing branch.

2. An apparatus according to claim 1, further comprising a multiplexer with inputs that are coupled to outputs of said parallel processing branches and which combines multiple, sub-rate inputs into a single, full-rate output.

3. An apparatus according to claim 1, wherein the frequency of the complex-valued sinusoid is established by a programmable coefficient within the recursive digital filter.

4. An apparatus according to claim 1, wherein the initial state of the recursive digital filter in at least one of the processing branches is established by the first and second writeable registers within said recursive digital filter.

5. An apparatus according to claim 1, wherein the transfer function of the recursive digital filter in at least one of said processing branches represents a recursive form of angle sum and difference formulas for trigonometric functions.

6. An apparatus according to claim 1, wherein the system output includes a first line that provides the real output samples and a second line that provides the imaginary output samples.

7. An apparatus according to claim 1, wherein the recursive digital filter in at least one of said processing branches has exactly 2 multipliers in the first stage and also has exactly 2 multipliers in the second stage, for a total of exactly 4 multipliers.

8. An apparatus according to claim 7, wherein the exactly 2 multipliers in each of the first stage and the second stage have inputs of cos $(m-\omega \cdot T_S)$ and sin $(m \cdot \omega \cdot T_S)$ for establishing the frequency of the complex-valued sinusoid, where: m is a total number of said processing branches, frequency $f=\omega/2\pi$, is the frequency of the complex-valued sinusoid, and $T_S$ is the sampling period of the complex-valued sinusoid at the desired full sampling rate.

9. An apparatus according to claim 1, wherein the recursive digital filter in said at least one of said processing branches implements the difference equations:

$$x_n = \cos(m \cdot \omega \cdot T_S) \cdot x_{n-m} - \sin(m \cdot \omega \cdot T_S) \cdot y_{n-m} \text{ and}$$

$$y_n = \sin(m \cdot \omega \cdot T_S) \cdot x_{n-m} + \cos(m \cdot \omega \cdot T_S) \cdot y_{n-m},$$

where m is a total number of said processing branches, frequency $f=\omega/2\pi$ is the frequency of the complex-valued sinusoid, $x_n$ are the real samples of the complex-valued sinusoid, $y_n$, are the imaginary samples of the complex-valued sinusoid, and $T_S$ is the sampling period of the complex-valued sinusoid at the desired full sampling rate.

10. An apparatus according to claim 1, wherein the recursive digital filter in at least one of said processing branches utilizes exactly 3 multipliers.

11. An apparatus according to claim 10, wherein the exactly 3 multipliers have inputs of $\alpha+\beta=\sin(m \cdot \omega \cdot T_S)+\cos(m \cdot \omega - T_S)$, $\alpha-\beta=\sin(m \cdot \omega \cdot T_S)-\cos(m \cdot \omega \cdot T_S)$, and $\beta=\cos(m \cdot \omega \cdot T_S)$ for establishing the frequency of the complex-valued sinusoid, where: m is a total number of said processing branches, frequency $f=\omega/2\pi$ is the frequency of the complex-valued sinusoid, and $T_S$ is the sampling period of the complex-valued sinusoid at the desired full sampling rate.

12. An apparatus according to claim 10, wherein the recursive digital filter in said at least one of said processing branches utilizes exactly 3 writeable delay registers.

13. An apparatus according to claim 10, wherein the recursive digital filter in said at least one of said processing branches implements the difference equations:

$$x_n = \cos(m \cdot \omega \cdot T_S) \cdot (x_{n-m} + y_{n-m}) - (\sin(m \cdot \omega \cdot T_S) + \cos(m \cdot \omega \cdot T_s)) \cdot y_{n-m} \text{ and}$$

$$y_n = \cos(m \cdot \omega \cdot T_S) \cdot (x_{n-m} + y_{n-m}) + (\sin(m \cdot \omega \cdot T_S) - \cos(m \cdot \omega \cdot T_S)) \cdot x_{n-m},$$

where m is a total number of said processing branches, frequency $f=\omega/2\pi$ is the frequency of the complex-valued sinusoid, $x_n$ are the real samples of the complex-valued sinusoid, $y_n$ are the imaginary samples of the complex-valued sinusoid, and $T_S$ is the sampling period of the complex-valued sinusoid at the desired full sampling rate.

* * * * *

UNITED STATES PATENT AND TRADEMARK OFFICE
CERTIFICATE OF CORRECTION

PATENT NO.      : 9,772,972 B2
APPLICATION NO. : 15/205817
DATED           : September 26, 2017
INVENTOR(S)     : Christopher Pagnanelli It is certified that error appears in the above-identified patent and that said Letters Patent is hereby corrected as shown below:

In the Specification

Column 1, Lines 41-42, change "$f \leq \frac{1}{2} \cdot f_s$" to -- $f \nleq \frac{1}{2} \cdot f_s$ --.

Column 2, Lines 62-63, change
"$\sin(\varphi_n + \theta) = \sin(\theta) \cdot \cos(\varphi_n) - \cos(\theta) \cdot \sin(\varphi_n) \leftrightarrow y_n = \sin(\theta) \cdot x_{n-1} - \cos(\theta) \cdot y_{n-1}$" to
-- $\sin(\varphi_n + \theta) = \sin(\theta) \cdot \cos(\varphi_n) + \cos(\theta) \cdot \sin(\varphi_n) \leftrightarrow y_n = \sin(\theta) \cdot x_{n-1} + \cos(\theta) \cdot y_{n-1}$ --.

Column 7, Line 9, change "$x_{2n+1} = \left(4 \cdot \cos^2(\theta)^{-1}\right) \cdot x_{2n-1} - 2 \cdot \cos(\theta) \cdot x_{2n-2}$" to
-- $x_{2n+1} = \left(4 \cdot \cos^2(\theta) - 1\right) \cdot x_{2n-1} - 2 \cdot \cos(\theta) \cdot x_{2n-2}$ --.

Column 8, Line 55, change "$x_{2n} = x_0, x_2, x_4, x_6, x_8,$" to -- $x_{2n} = x_0, x_2, x_4, x_6, x_8, \ldots$ --.

Column 8, Line 59, change "$x_{2n+1} = x_1, x_3, x_5, x_7, x_9,$" to -- $x_{2n+1} = x_1, x_3, x_5, x_7, x_9, \ldots$ --.

Column 8, Line 63, change "$x_n = x_0, x_1, x_2, x_3, x_4, x_5, x_6, x_7, x_8, x_9,$" to -- $x_n = x_0, x_1, x_2, x_3, x_4, x_5, x_6, x_7, x_8, x_9, \ldots$ --.

In the Claims

Column 14, Claim 8, Line 67, change "$\cos(m - \omega \cdot T_s)$" to -- $\cos(m \cdot \omega \cdot T_s)$ --.

Column 15, Claim 11, Lines 23-24, change "$\alpha + \beta = \sin(m \cdot \omega \cdot T_s) + \cos(m \cdot \omega - T_s)$" to
-- $\alpha + \beta = \sin(m \cdot \omega \cdot T_s) + \cos(m \cdot \omega \cdot T_s)$ --.

Column 15, Claim 11, Line 24, change "$\alpha - \beta = \sin(m \cdot \omega \cdot T_s) - \cos\ (m \cdot \omega \cdot T_s)$" to
-- $\alpha - \beta = \sin(m \cdot \omega \cdot T_s) - \cos(m \cdot \omega \cdot T_s)$ --.

Signed and Sealed this
Twenty-eighth Day of November, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,772,972 B2

Column 16, Claim 13, Lines 13-14, change

" $x_n = \text{Cos}(m \cdot \omega \cdot T_S) \cdot (x_{n-m} + y_{n-m}) - (\text{Sin}(m \cdot \omega \cdot T_S) + \text{Cos}(m \cdot \omega \cdot T_S)) \cdot y_{n-m}$ " to -- $x_n = \cos(m \cdot \omega \cdot T_S) \cdot (x_{n-m} + y_{n-m}) - (\sin(m \cdot \omega \cdot T_S) + \cos(m \cdot \omega \cdot T_S)) \cdot y_{n-m}$ --.